United States Patent Office 3,586,504

Patented June 22, 1971

3,586,504
PHOTORESIST DEVELOPERS AND METHODS

Alfred E. Coates and Bertalan J. Vegh, Rochester, N.Y., assignors to Eastman Kodak Company, Rochester, N.Y.

No Drawing. Filed Oct. 24, 1969, Ser. No. 869,331
Int. Cl. G03c 5/00
U.S. Cl. 96—35.1 10 Claims

ABSTRACT OF THE DISCLOSURE

Alkylphenoxy poly(hydroxyalkylene oxide), e.g., p-nonylphenoxy polyglycidol, are included in aqueous alkali solutions which are used in methods for developing photoresist compositions which on exposure to light image are converted in exposed areas from aqueous alkali insoluble to aqueous alkali soluble.

This invention relates to methods and materials for developing photoresist materials. In one of its aspects this invention relates to methods employing aqueous alkaline solutions to develop positive working photoresist materials. In another of its aspects this invention relates to methods for developing resist images for use in preparing micrometallic images on glass plates.

The recent boom in the electronics industry and technology has created an ever increasing demand for photoresist materials and methods for using such resists, for example, in preparing electronic circuitry, and especially for microelectronics mask-making. This has resulted in a number of compositions both positive working and negative working which can be used with varying degrees of success. Such compositions are usually used by coating a thin layer of material on the desired substrate, e.g., chromium coated glass, then prebaking (commercially prebaked resist coated materials are available), exposing to a light image, developing, postbaking, and then etching using the developed resist to protect the desired areas of the substrate from the etchant. Of the many important operations involved in such a process, one of the most sensitive and most important is the development.

With a positive working system the development is normally accomplished by spraying or immersing the coated substrate in an alkaline aqueous solution for a sufficient period to totally remove the exposed resist material with minimum damage to the unexposed resist material. Although it is desirable to minimize development time, the developer should provide latitude so that overdevelopment (e.g., leaving the coated substrate in developer for a longer period than necessary) will not seriously affect the quality of the resist image. The developer should also have capacity for developing a reasonable amount of coated resist and should be maintained relatively free of undissolved deposits from the resist. Developers which have previously been utilized have generally been deficient in one or more of these areas. Consequently, investigation has been undertaken to find developer compositions and methods which have desirable developer characteristics but which are free from such deficiencies.

According to the present invention, we have found that incorporating p-alkylphenoxy poly(hydroxyalkylene oxide) into aqueous alkaline developer solutions results in developer compositions which are rapid with minimum detrimental effect on unexposed areas and have wide latitude and effective capacity. We have found that aqueous alkaline developer solutions containing alkylphenoxy poly(hydroxyalkylene oxide) are surprisingly effective as compared to similar solutions containing even close analogs of alkylphenoxy poly(hydroxyalkylene oxide).

According to one advantageous embodiment of the present invention the alkylphenoxy poly(hydroxyalkylene oxide) materials are used in an otherwise conventional process for preparing resists on an element comprising a base member, for example, having a metal, plastic, glass, etc. support, desirably coated with an etching layer, e.g., of a separate metal or plastic, with an alkali insoluble light sensitive coating on the base. The process includes exposing the light sensitive polymer coating to a light image whereby the polymer is rendered aqueous alkali soluble in areas receiving exposure and removing the exposed polymer with a dilute aqueous alkaline developer, e.g., by spraying, immersing the coated material, etc., with the improvement wherein the developer further contains the alkylphenoxy poly(hydroxyalkylene oxide). Although the amount of alkylphenoxy poly(hydroxyalkylene oxide) surfactant included in the developer can vary depending upon the particular resist material employed, the method of contacting the resist with the developer, the extent of agitation, the particular surfactant selected, etc., it is usually desirable to include less than 1%, normally less than 0.5%, and preferably less than about 0.2% (0.05–0.15%) based on the total weight of solution.

The amount of hydroxide in such solutions may also vary but normally is maintained below about 5% and desirably between about 2 and 3% based on the total weight of the solution. The hydroxide is normally supplied as a soluble metal hydroxide desirably as an alkali metal hydroxide, e.g., sodium hydroxide or potassium hydroxide. The developer temperature may vary but room temperature is normally employed.

The alkylphenoxy poly(hydroxyalkylene oxide) according to the present invention advantageously has the general formula:

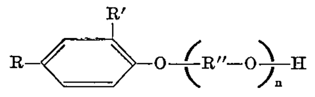

wherein:

R represents an alkyl group especially having from about 6–14 carbon atoms and advantageously having about 9 carbon atoms;

R′ represents an alkyl group such as R or H; and

R″ represents a hydroxyalkylene group, e.g., having from about 2 to 4 carbon atoms, advantageously having 3 carbon atoms, especially wherein —R″—O— represents the reacted residue of glycidol, ideally wherein —R″— represents $$—CH_2CH(CH_2OH)— \text{ and } —CH_2CHOHCH_2—$$

groups in ratio to about 4 to about 6, respectively; and

*n* represents an average of from about 6–18, especially about 6–12 or an average of about 10 and desirably with a high percentage (over 50 percent) of the molecules having *n* equal about 10.

The alkylphenoxy poly(hydroxyalkylene oxide) can be prepared by known methods, desirably by the gradual addition of a hydroxyalkylene oxide, e.g., glycidol, to a strongly basic solution of alkylphenol, e.g., p-nonylphenol, or in accordance with the general disclosure in British Pat. No. 1,022,878.

The developer solution, therefore, advantageously consists essentially of about 96–98% water, about 2–3 weight percent sodium hydroxide, and about 0.05 to about 0.15 weight percent p-nonylphenoxy polyglycidol having about 10 reacted glycidol moieties per p-nonylphenoxy moiety.

According to another advantageous embodiment of the present invention the above-described developers are utilized in methods for developing resist coatings which at least prior to exposure contained light sensitive polymers having quinone diazide groups linked through nitrogen atoms to the polymer chain, especially those prepared by reacting a polymer having an amino appendage (e.g., poly aminostyrene-styrene) with a sulfonyl halide (e.g., chloride) substituted naphthoquinone (e.g., 1,2-naphthoquinone-2-diazide-5 - sulfonyl chloride) as disclosed in Rauner et al. U.S. application Ser. No. 684,636, filed Nov. 21, 1967.

In another advantageous embodiment of the present invention the above-described developers are utilized in methods for developing resist coatings which at least prior to exposure contain polyalkylene glycols, e.g., polyethylene glycols, end-capped with o-quinone diazide groups, desirably sulfonylchloride naphthoquinone diazides, advantageously in mixtures with light sensitive polymers having quinone diazide groups linked to the polymer chain through nitrogen atoms, as described in Rauner et al. U.S. application Ser. No. 857,587 filed Sept. 12, 1969, entitled "Light-Sensitive Quinone Diazide Polymers and Polymer Compositions." Such compositions and mixtures also desirably include acid resistant compositions such as commercially available resins such as cresol-formaldehyde resins.

In an especially advantageous embodiment of the present invention the developers of the present invention are utilized in microimagery techniques advantageously with resist compositions as described above coated in a layer having a thickness less than about 1.5$\mu$ on a metallic, desirably chromium, layer and less than about 0.2$\mu$ thick which is coated on a dimensionally stable acid resistant support, desirably glass. Such materials when utilized with the developers of the present invention can result in microelectronic masks of extremely high quality.

The following examples are intended to illustrate our invention and/or advantages thereof.

EXAMPLE 1

A metal clad plate comprising a glass support, a thin (less than about 0.10$\mu$ thick) uniform layer of chromium on said support, and a thin (less than about 0.8$\mu$ thick) uniform layer of prebaked positive working resist material on the chromium layer which resist material comprises an acid resistant cresol formaldehyde reaction product (Alnoval 429K) and a light sensitive polymer prepared by reacting p-aminostyrene:styrene (1:5) with 1,2-naphthoquinone-2-diazide-5-sulfonyl chloride is exposed for 10 seconds to a positive light image using a conventional vacuum frame and a 100-watt, compact mercury-vapor arc, with optics (*f*/2.8 lens with 5-inch focal lengths) adjusted for a 6-inch diameter field at a working distance of 24 inches, and developed in a solution containing about 97% water, about 2% by weight sodium hydroxide, and about 0.7% by volume (about 0.8% by weight) of a 50% aqueous solution of p-nonylphenoxy polyglycidol having an average of about 10 reacted glycidol moieties per nonylphenoxy moiety (Surfactant 10G, as obtained from Olin Mathieson Corp.) by immersing and gently agitating the exposed plate in the developer solution for about 10 seconds to remove the exposed resist material. The developed plate is then dried with a gentle flow of clean dry air, baked in an oven for about 10 minutes at 150° C., and cooled. The plate having the resist formed thereon is then treated in an etching bath containing water, nitric acid, and ceric ammonium nitrate to remove the chromium from areas not covered by resist and then washed. The unexposed resist is then removed by washing with methanol. This results in a satisfactory chromium mask corresponding to the positive exposure image.

EXAMPLE 2

The procedure according to Example 1 is followed except that the plate is immersed in the developer solution for 50 seconds rather than 10 seconds. Similar results are obtained.

EXAMPLE 3

The procedure according to Example 1 is followed except that the developer solution contains about 2.2% by weight sodium hydroxide. Similar results are obtained.

EXAMPLE 4 (COMPARATIVE)

The procedure according to Example 1 is followed except that the developer solution contains p-octylphenoxy-poly(ethylene oxide) having about 9.5 reacted ethylene oxide moieties per octylphenoxy moiety in place of the p-nonylphenoxy polyglycidol of Example 1. The developer functions very slowly and development is not complete after 10 seconds. The development is not complete until about 1 minute and then with noticeable damage to the resist. Development for periods in excess of 1 minute causes loss of resist imagery.

EXAMPLE 5

The procedure according to Example 1 is followed except that the resist material includes a polyethylene glycol end-capped with 5 - sulfonyl-1,2-naphthoquinone-2-diazide groups and a dye (Sudan IV dye) in addition to the components indicated in Example 1. Outstanding results are achieved.

EXAMPLE 6 (COMPARATIVE)

The procedure according to Example 5 is followed except that the surfactant of Example 4 is utilized in the developer in place of the alkylphenoxy poly(hydroxyalkylene oxide) surfactant. The developer is very slow, severely damages the unexposed resist (40–50% reduction in resist thickness) and has very poor latitude.

EXAMPLE 7

The procedure according to Example 5 is followed except that the developer solution contains about 2.5 weight percent sodium hydroxide and about 0.2 volume percent (density about 1.1 at 25° C.) of a 50% by weight solution of p-nonylphenoxy polyglycidol. Development is complete after immersion for about 3 seconds to form a resist remarkably free from pinholes. Excellent results are obtained.

EXAMPLE 8

The procedure according to Example 7 is followed except that the plate is immersed in developer for about 4 times as long as that of Example 7. No appreciable damage takes place to the resist image. Excellent results are obtained.

EXAMPLE 9

The procedure according to Example 7 is followed except that the developer contains about 2.8 percent by weight sodium hydroxide and about 0.2 volume percent p-nonylphenoxy polyglycidol. Similar results to those of Example 7 are obtained.

EXAMPLE 10

The procedure according to Example 7 is followed except that the developer solution is prepared by adding 25 gm. sodium hydroxide pellets in 1 liter of distilled water and adding about 2 cc. of Surfactant 10G (a p-nonylphenoxy polyglycidol obtained from Olin Mathieson Corp.). Excellent results are obtained.

The invention has been described in detail with particular reference to preferred embodiments thereof, but it will be understood that variations and modifications can be effected within the spirit and scope of the invention.

We claim:

1. In a process for the preparation of resists on an element comprising a base member and an aqueous alkali insoluble light sensitive coating on said base comprising:

(a) exposing said polymer to a light image whereby said polymer in areas receiving exposure is rendered aqueous alkali soluble, and (b) removing the exposed polymer with a dilute aqueous alkaline solution, the improvement wherein the aqueous solution further contains p-alkylphenoxy poly(hydroxyalkylene oxide).

2. The invention according to claim 1 and wherein said alkylphenoxy poly(hydroxyalkylene oxide) has the general formula:

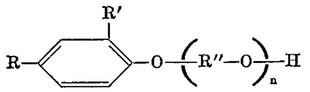

wherein

R represents an alkyl group having from about 6–14 carbon atoms;

R′ represents H or an alkyl group having from about 6–14 carbon atoms;

R″ represents a hydroxyalkylene group having from about 2 to 4 carbon atoms; and

*n* represents an average of about 6–18.

3. The invention according to claim 1 and wherein said alkylphenoxy poly(hydroxyalkylene oxide) has the general formula

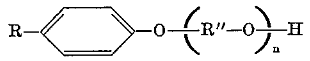

wherein

R represents an alkyl group having about 9 carbon atoms;

R″ represents a reacted glycidol moiety; and

*n* represents an average of about 6–18.

4. The invention according to claim 1 and wherein said alkylphenoxy poly(hydroxyalkylene oxide) is a p-nonylphenoxy polyglycidol having about 6–12 reacted glycidol moieties per nonylphenoxy moiety.

5. The invention according to claim 1 and wherein said aqueous solution consists essentially of water, alkali metal hydroxide, and p-alkylphenoxy poly(hydroxyalkylene oxide).

6. The invention according to claim 1 and wherein said aqueous solution consists essentially of about 96–98% water, about 2 to about 3 weight percent sodium hydroxide and about 0.05 to about 0.15 weight percent p-nonylphenoxy polyglycidol having about 10 reacted glycidol moieties per nonylphenoxy moiety.

7. The invention according to claim 1 and wherein said light sensitive coating comprises a light sensitive polymer having quinone diazide groups appended to the polymer backbone through a nitrogen atom and wherein said alkylphenoxy poly(hydroxyalkylene oxide) has the general formula

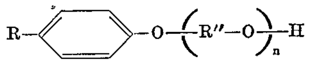

wherein

R represents an alkyl group having about 9 carbon atoms;

R″ represents a reacted glycidol moiety; and

*n* represents an average of about 6–18.

8. The invention according to claim 1 and wherein said element comprises a glass base, a chromium coating less than about 0.2μ thick on said glass base and a layer of resist material less than about 1.5μ thick comprising a light sensitive polymeric mixture containing an o-quinone diazide end-capped polyethylene glycol and the reaction product of poly(p-aminostyrene-styrene) with 1,2-naphthoquinone-2-diazide sulfonyl chloride on said chromium coating and said p-alkylphenoxy poly(hydroxyalkylene oxide) is p-alkylphenoxy polyglycidol having about 6–12 reacted glycidol moieties per alkylphenoxy moiety.

9. The invention according to claim 1 and wherein said element comprises a glass base, a chromium coating less than about 0.2μ thick on said glass base and a resist material less than about 1.5μ thick comprising a light sensitive polymeric mixture containing an o-cresol-formaldehyde resin, 5-sulfonyl-1,2-naphthoquinone diazide end-capped polyalkylene glycol, and the reaction product of poly(p-aminostyrene-styrene) with 1,2-naphthoquinone-2-diazide-5-sulfonyl chloride and said p-phenoxy poly(hydroxyalkylene oxide) is p-alkylphenoxy polyglycidol having about 6–12 reacted glycidol moieties per alkylphenoxy moiety and said alkyl group contains about 6–14 carbon atoms.

10. The invention according to claim 9 and wherein said developer consists essentially of about 96–98% water, about 2 to about 3 weight percent sodium hydroxide, and about 0.05 to about 0.15 weight percent p-nonylphenoxy polyglycidol having about 10 reacted glycidol moieties per nonylphenoxy moiety.

References Cited

UNITED STATES PATENTS

| | | | |
|---|---|---|---|
| 3,046,127 | 7/1962 | Barney et al. | 96—35.1 |
| 3,255,004 | 6/1966 | Thommes | 96—35.1 |
| 3,475,171 | 10/1969 | Alles | 96—115X |

FOREIGN PATENTS

| | | |
|---|---|---|
| 1,022,878 | 3/1966 | Great Britain. |

JOHN T. GOOLKASIAN, Primary Examiner

J. C. GIL, Assistant Examiner